US012748163B2

(12) United States Patent
Gopp

(10) Patent No.: US 12,748,163 B2
(45) Date of Patent: Sep. 29, 2026

(54) METHOD AND DEVICE FOR TESTING A VOLTAGE CONVERTER

(71) Applicant: Omicron electronics GmbH, Klaus (AT)

(72) Inventor: David Gopp, Dornbirn (AT)

(73) Assignee: Omicron electronics GmbH, Klaus (AT)

(*) Notice: Subject to any disclaimer, the term of this patent is extended or adjusted under 35 U.S.C. 154(b) by 212 days.

(21) Appl. No.: 18/684,160

(22) PCT Filed: Aug. 16, 2022

(86) PCT No.: PCT/EP2022/072866

§ 371 (c)(1),
(2) Date: Feb. 15, 2024

(87) PCT Pub. No.: WO2023/021037

PCT Pub. Date: Feb. 23, 2023

(65) Prior Publication Data

US 2024/0426945 A1 Dec. 26, 2024

(30) Foreign Application Priority Data

Aug. 20, 2021 (AT) .............................. A 50676/2021

(51) Int. Cl.
*G01R 23/16* (2006.01)
*G01R 31/62* (2020.01)

(52) U.S. Cl.
CPC ............. *G01R 31/62* (2020.01); *G01R 23/16* (2013.01)

(58) Field of Classification Search
CPC .. G01R 31/62; G01R 31/72; G01R 23/16–20; G01R 23/00; G01R 23/02
See application file for complete search history.

(56) References Cited

U.S. PATENT DOCUMENTS

| | | | | |
|---|---|---|---|---|
| 4,857,827 A * | 8/1989 | Zoltan | .................... | G01R 35/02 324/726 |
| 6,307,383 B1 * | 10/2001 | Kephart, Jr. | ........... | G01R 31/62 324/726 |

(Continued)

FOREIGN PATENT DOCUMENTS

| | | |
|---|---|---|
| CN | 101701995 B | 11/2011 |
| CN | 110763899 | 2/2020 |

(Continued)

OTHER PUBLICATIONS

Search Report (with English-language machine translation), counterpart Russian App. No. 2024106446 (Aug. 26, 2024) (4 pages).

(Continued)

*Primary Examiner* — Lee E Rodak
*Assistant Examiner* — Demetrius R Pretlow
(74) *Attorney, Agent, or Firm* — Cook Alex Ltd.

(57) ABSTRACT

The present invention relates to a device (50) for testing a voltage converter (10, 20), having a frequency response analyzer (60) and an impedance converter (70). The frequency response analyzer (60) is configured to measure an electrical transfer function over a predefined frequency range. The frequency response analyzer (60) has a test signal output (61) for outputting a test signal for the voltage converter (10, 20), a reference signal input (64) for receiving a reference signal which is applied to the voltage converter (10, 20) for the purpose of testing the voltage converter (10, 20), and a response signal input (67) having a predefined input impedance (68) for receiving a response signal from the voltage converter (10, 20). The impedance converter (70) comprises an impedance converter input (71), which has a variable input impedance (72) which can be adjusted to an impedance of the voltage converter (10, 20), and an impedance converter output (75), which is coupled to the response signal input (67) and has an output impedance (74)

(Continued)

matched to the input impedance (68) of the response signal input (67).

16 Claims, 3 Drawing Sheets

(56) References Cited

U.S. PATENT DOCUMENTS

| | | | | |
|---|---|---|---|---|
| 2001/0038290 | A1 * | 11/2001 | Coffeen | G01R 31/62 324/547 |
| 2015/0288277 | A1 | 10/2015 | Yan et al. | |
| 2018/0024180 | A1 * | 1/2018 | Pütter | G01R 27/2611 324/547 |
| 2021/0109146 | A1 | 4/2021 | Cheim | |

FOREIGN PATENT DOCUMENTS

| | | | |
|---|---|---|---|
| DE | 10 2018 200869 | | 7/2019 |
| JP | 2011-252752 | | 12/2011 |
| RU | 2240571 | C1 | 11/2004 |
| RU | 2795674 | C1 | 5/2023 |

OTHER PUBLICATIONS

Search Report, counterpart Austrian App. No. A50676/2021 (Jun. 9, 2022) (with English machine translation) (2 pages).

International Search Report and Written Opinion, counterpart International App. No. PCT/EP2022/072866 (Dec. 12, 2022) (with English translation of ISR) (13 pages).

David Gopp, Einflussgrößen bei der modellbasierten Prüfung von kapazitiven Spannungswandlern—Was sind die einflussreichsten Parameter der modellbasierten Prüfung von kapazitiven Spannungswandlern und wie wirken sich diese auf den Übersetzungs- und Phasenfehler aus?, Master of Science in Engineering (Aug. 2019) (English abstract on page III) (118 pages).

Omicron electronics GmbH, FRANEO 800—Die nächste Generation für eine zuverlässig Kern- und Wicklungsdiagnose von Leistungstransformatoren—Brochure (May 2019) (with English machine translation) (24 pages).

Haefely AG, 4861 High Precision Standard Electronic Voltage Dividers—Datasheet (Apr. 2020) (6 pages).

Haefely Test AG, FRA 5310—Frequency Response Analyser, Version 3.2—Operating Instructions (2005) (71 pages).

Uhrig et al., Zuverlässige und reproduzierbare Messungen der Übertragungsfunktion (SFRA) an Leistungstransformatoren (Oct. 2018) (with English machine translation) (32 pages).

Melone et al., New Methodology for On-Site Measurement of Voltage Transformer Magnitude and Phase Ratio as a Function of Frequency, $25^{th}$ International Conference on Electricity Distribution, Paper No. 2230 (Jun. 3-6, 2019) (5 pages).

Meyer et al., Accuracy of Harmonic Voltage Measurements in the Frequency Range up to 5 kHz using Conventional Instrument Transformers, 21st International Conference on Electricity Distribution, Paper 0917 (Jun. 6-9, 2011) (4 pages).

Meyer et al., Frequency Response Characteristic of MV Voltage Transformers and their Accurate Measurement up to 2.5/3 kHz, Omicron 2013—Instrument Transformer Measurement Forum (2013) (7 pages).

Meyer et al., Impact of Voltage Instrument Transformers on the Accuracy of Harmonic Measurements in a 330 KV Transmission Grid, Omicron 2015—Instrument Transformer Measurement Forum (2015) (7 pages).

* cited by examiner

METHOD AND DEVICE FOR TESTING A VOLTAGE CONVERTER

The present application is a U.S. National Stage of PCT International Patent Application No. PCT/EP2022/072866, filed Aug. 16, 2022, which claims priority to Austrian (AT) Application No. A50676/2021, filed Aug. 20, 2021, both of which are hereby incorporated herein by reference.

FIELD OF THE INVENTION

The present invention relates to a device for testing a voltage converter, for example an inductive voltage converter or a Low Power Voltage Transformer (LPVT), and a corresponding method for testing a voltage converter.

BACKGROUND

Due to the change in the topology of electricity distribution and transmission grids towards decentralization in power generation, the quantity of electronic components is increasing significantly. The so-called "green" energy (from wind farms, solar parks, and other alternative energy sources) is increasing significantly. The electrical energy generated in this way is frequently fed into the distribution and transmission grids using semiconductor technologies. Energy from these sources is frequently dependent on environmental changes and therefore any change in the time of day or weather has a direct influence on a number of switching operations necessary to control grid stability. Furthermore, the increasing number of loads based on electronically controlled technologies, such as power electronics or variable-frequency drives, has effects on the grid. These influences can lead to an increase in transient voltage pulses, harmonics, sub-harmonics or offset voltages with voltages from direct current up to several kHz. Such phenomena can only be acquired or monitored with high-voltage measurements that have a correspondingly high accuracy, in particular in the range of direct current up to a frequency of several kHz.

For this purpose, voltage converters can be used as measuring converters for measuring alternating voltages in the field of electrical energy engineering. The function of a voltage converter is to proportionally transfer a high voltage to be measured to lower voltage values. This lower voltage, for example values around 100 V, is transmitted to voltmeters, energy meters and similar devices, for example for measurement purposes or protective purposes. A voltage converter can be realized as an inductive (so-called conventional) voltage converter or as a low-power voltage converter (so-called LPVT, Low Power Voltage Transformer, or LPIT, Low Power Instrument Transformer).

LPVTs can take different forms. In addition to an ohmic voltage divider and a capacitive voltage divider (non-damped and damped), ohmic-capacitive voltage dividers can also be found in a wide range of variants in the field. Ohmic-capacitive voltage converters are formed from two voltage dividers connected in parallel, one of which is a capacitive voltage divider and the other is an ohmic voltage divider. Both the capacitive voltage divider and the resistive voltage divider usually consist of at least two elements connected in series. The parallel connection of these two voltage dividers is also known as an RC divider. One end of the RC divider is connected to the high voltage to be measured, and the other end to earth. A lower voltage, which is proportional to the high voltage to be measured and which can be fed to a voltmeter, is applied to a tap between the RC divider. Faults in the ohmic-capacitive voltage converter can be caused by defects in the ohmic-capacitive voltage divider. There are various reasons for defects in the capacitors of the capacitive voltage divider, for example the ingress of moisture into the insulation.

Inductive voltage converters are in principle structured like transformers. They consist of a primary coil, which is electrically connected to the high voltage to be measured, and a secondary coil which is electrically isolated but generally leads in an earthed manner on one side to the connected devices for safety reasons. Faults in the inductive voltage converter can occur, for example due to defects in the coil insulations, due to displacement of windings of the coils or due to defects in an iron core which magnetically couples the primary coil and the secondary coil.

Across the globe, mainly conventional voltage converter technologies are employed, but the number of LPVTs is increasing significantly, because they are more suitable regarding grid quality measurement.

Voltage converters (both conventional voltage converters and LPVTs), due to their design, have a pronounced frequency-dependent transmission behavior. Applications for recording the above-mentioned phenomena and thus for monitoring the grid quality require information on this frequency-dependent transmission behavior. Appropriate measurement methods and evaluation methods are defined regarding the determination and assessment of the transmission properties and thus regarding the suitability of LPVTs and conventional voltage converters for the measurement of grid quality. Since very extensive electrical apparatuses are required for these measurement methods, these measurement methods are substantially performed at the manufacturer or on-site at correspondingly greater expense. As a rule, a reference design is selected that can measure frequencies of up to 9 kHz. To determine the frequency behavior of conventional voltage converters, a so-called dual-frequency method is used, which achieves a pre-linearization of the core by means of a 50 Hz fundamental frequency. The high-frequency components are modulated to this fundamental frequency.

SUMMARY OF THE INVENTION

There is a need for improved possibilities for testing voltage converter, both conventional voltage converters and LPVTs, in particular with methods and devices which can be easily applied on-site.

According to the present invention, a device for testing a voltage converter and a method for testing a voltage converter, as defined in the independent claims, are provided. The dependent claims define embodiments of the invention.

A device according to the invention for testing a voltage converter comprises a frequency response analyzer and an impedance converter. The frequency response analyzer is configured to measure an electrical transfer function over a predefined frequency range. The frequency response analyzer has a test signal output, a reference signal input, and a response signal input.

At the test signal output, the frequency response analyzer can output a test signal for the voltage converter to be tested. The test signal can, for example, comprise a voltage signal with a predefined voltage and variable frequency. The frequency can be varied in a range of from 1 Hz to 30 MHz, for example, in particular in a range of from 20 Hz to 2 MHz. The voltage can for example be in a range of a few volts, for example in the range of 5-300 V. The voltage can be 10 V, for example. The voltage can comprise an alternating voltage for example, with a voltage of 10 $V_{PP}$, for example. The test signal output can comprise a terminal for a coaxial line, whereby the test signal is output on the inner conductor of the coaxial line and the outer conductor of the coaxial cable is coupled to ground. On the voltage converter to be tested, the inner conductor is connected to a terminal of the voltage converter, for example on the primary side of the voltage converter, and the outer conductor is coupled to ground of the voltage converter. As a result, it is possible to reduce or prevent interference signals from the environment from being transmitted to the test signal.

The frequency response analyzer can receive a reference signal via the reference signal input. For example, the reference signal input can be coupled to the same terminal of the voltage converter at which the test signal is fed in. The reference signal input can comprise a terminal for a coaxial cable, with the reference signal being received via the inner conductor of the coaxial cable and the outer conductor being coupled to ground. At the voltage converter, the inner conductor is coupled to the same terminal at which the test signal is fed-in, and the outer conductor is coupled to the ground of the voltage converter. The test signal which is fed into the voltage converter can be precisely determined via the reference signal input and used as a reference signal. The transfer function of the voltage converter can be precisely determined on the basis of this reference signal.

At the response signal input, the frequency response analyzer can receive a response signal, which, in response to the test signal output, is generated by the voltage converter to be tested. The response signal input has a predefined input impedance, for example 50 ohms.

The frequency response analyzer can, for example, be a device as used for examining power transformers by means of a sweep frequency response analysis (SFRA). Such a frequency response analyzer can be configured such that it can be transported by an operator, for example as a portable device in a carry case.

The impedance converter has an impedance converter input and an impedance converter output. The impedance converter input has an adjustable input impedance. The impedance converter output is coupled to the response signal input of the frequency response analyzer and has an output impedance matched to the input impedance of the response signal input. The impedance converter input can for example be coupled to a further terminal of the voltage converter, for example a terminal of a secondary side of the voltage converter. The impedance converter input can comprise a terminal for a coaxial cable, whereby the terminal of the secondary side of the voltage converter is coupled to the inner conductor of the coaxial cable and the outer conductor of the coaxial cable is coupled to ground both at the voltage converter and at the impedance converter. The impedance converter thus receives an output signal from the voltage converter, which is outputted by the latter in response to the test signal, and forwards this output signal as a response signal to the response signal input of the frequency response analyzer, whereby the impedance is matched accordingly.

In summary, the device is based on the approach of the SFRA method and uses for example an SFRA measuring device as a frequency response analyzer. Both conventional and LPVT voltage converters can inherently have any impedances which generally do not correspond to the input impedance of the response signal input of the SFRA measuring device. For example, the response signal input of the SFRA measuring device, i.e. of the frequency response analyzer, can have a predefined input impedance of 50 ohms, whereas conventional voltage converters can have an impedance in the range up to a few 100 ohms and LPVTs can even have an impedance up to a few megaohms. An output impedance of the test signal output of the frequency response analyzer can be 50 ohms and an input impedance of the reference signal input of the frequency response analyzer can be 50 ohms. However, the response signal input is the critical path when determining frequency-dependent transmission properties of conventional voltage converters and LPVTs. This means that a deviation of the impedance on the secondary side of the voltage converter from the input impedance of the SFRA measuring device leads to inaccurate determinations of the frequency-dependent transmission properties of the voltage converter. To avoid this, the impedance converter is connected between the voltage converter and the response signal input. The output impedance of the impedance converter output is matched to the input impedance of the response signal input. The input impedance of the impedance converter input can be adjusted to the output impedance of the voltage converter. The input impedance of the impedance converter input can, for example, be adjustable in a range of from 30 ohms to 100 megaohms, preferably in a range of from 50 ohms to 100 megaohms. The output impedance of the impedance converter agrees with the input impedance of the response signal input, so that there is an impedance match on both sides of the impedance converter. Thus, the frequency-dependent transmission behavior of the voltage converter can be measured under optimum conditions (e.g. at nominal load of the voltage converter).

According to one embodiment, the device, which comprises the frequency response analyzer and the impedance converter, can be configured as a mobile portable device. In this context, mobile and portable means that the device can be carried by one individual person and can be accommodated in a carry case or a pocket, for example. The device can for example have a weight of a few kilograms, for example in the range of one to 10 kg.

According to one embodiment, the device comprises at least one battery that is configured to provide electrical power for the purpose of running the frequency response analyzer and/or the impedance converter. For example, a rechargeable battery can be provided for the frequency response analyzer and another rechargeable battery can be provided for the impedance converter. A common (rechargeable) battery can also be provided for supplying the frequency response analyzer and the impedance converter. The battery can, for example, be accommodated together with the frequency response analyzer and the impedance converter in the above-mentioned carry case or the above-mentioned bag, so that the entire device, including battery and any corresponding terminal wires, is mobile and portable. As a result, the device can be used quickly and easily to examine voltage converters in a variety of locations extending over large parts of, or over the entire, power supply network.

In a further embodiment, the impedance converter has an amplifier with adjustable amplification. As a result, response signals from the voltage converter to be tested can be adjusted and matched to a measurement range of the frequency response analyzer. Furthermore, it is possible to test a plurality of different voltage converters which may have a wide range of different transformation ratios between the primary side and the secondary side.

The invention further relates to a method of testing a voltage converter. In the method, a frequency response analyzer is provided which is configured to measure an electrical transfer function over a predefined frequency range. The frequency response analyzer comprises a test signal output for outputting a test signal for the voltage converter, a reference signal input for receiving a reference signal which is applied to the voltage converter for the purpose of testing the voltage converter, and a response signal input having a predefined input impedance for receiving a response signal from the voltage converter. Furthermore, an impedance converter is provided which has an impedance converter input with a variably adjustable input impedance and an impedance converter output. The impedance converter output has an output impedance which is matched to the input impedance of the response signal input of the frequency response analyzer. In other words, the impedance converter output of the impedance converter has substantially the same impedance as the response signal input of the frequency response analyzer, i.e. there is an impedance match. The impedance converter output of the impedance converter is coupled to the response signal input of the frequency response analyzer. Finally, the input impedance of the impedance converter input is adjusted to an impedance of the voltage converter to be tested, which means that there is also an impedance match between the voltage converter to be tested and the impedance converter input. Through the impedance match between the voltage converter to be tested and the impedance converter input, as well as between the impedance converter output and the response signal input, a transfer function of the voltage converter can be precisely identified.

According to one embodiment, the method may envisage calibrating the frequency response analyzer, the impedance converter and the measuring lines used. For example, the method comprises connecting the test signal output to the reference signal input and the impedance converter input via measuring lines which are connected to the test signal output, the reference signal input, and the impedance converter input respectively. For example, a first end of a first measuring line can be connected to the test signal output, a first end of a second measuring line can be connected to the reference signal input, and a first end of a third measuring line can be connected to the impedance converter input. The second ends of the three measuring lines are connected to one another. If the measuring lines are coaxial lines, the inner conductors of the second ends of the three measuring lines are connected to one another and the outer conductors of the second ends of the three measuring lines are connected to one another. The impedance converter output of the impedance converter is, as described previously, connected to the response signal input of the frequency response analyzer.

A plurality of test signals at different frequencies are outputted via the test signal output. A corresponding plurality of calibration values are acquired at the reference signal input and at the response signal input. It is clear that the test signal outputted via the test signal output is acquired at the response signal input via the impedance converter, i.e. via the third measuring line connected to the impedance converter input and via the coupling between the impedance converter output and the response signal input. Each calibration value of the plurality of calibration values is assigned to a corresponding test signal of the plurality of test signals, or rather to a corresponding frequency of the corresponding test signal.

Each calibration value of the plurality of calibration values can for example comprise an amplitude of a voltage signal at the reference signal input, an amplitude of a voltage signal at the response signal input, a ratio between the amplitude of the voltage signal at the reference signal input and the amplitude of the voltage signal at the response signal input, and/or a phase difference between the voltage signal at the reference signal input and the voltage signal at the response signal input.

On the basis of the calibration values, it is possible to adjust, for example, an amplification of the amplifier of the impedance converter, to take, for example, voltage drops on the measuring lines into account in subsequent measurements on a voltage converter. Phase differences caused by the measuring lines can likewise be taken into account in subsequent measurements on a voltage converter.

After the calibration, the connections between the second ends of the measuring lines are broken again.

To test a voltage converter, for example, the transfer function of the voltage converter can be determined at different frequencies. The transfer function can, for example, comprise a voltage ratio between a voltage on an input side and a voltage on an output side of the voltage converter over a predefined frequency range. Alternatively or in addition, the transfer function can, for example, comprise a phase shift between a voltage on an input side and a voltage on an output side of the voltage converter over a predefined frequency range.

According to one embodiment, the test signal output and the reference signal input, for example, can be connected to a first terminal of the voltage converter via corresponding measuring lines. The first terminal of the voltage converter can for example be a terminal on an input side, for example a primary side, of the voltage converter. Furthermore, the impedance converter input can be connected to a second terminal of the voltage converter via a measuring line. The second terminal of the voltage converter can be, for example, a terminal on an output side, for example a secondary side of the voltage converter. Several test signals are outputted via the test signal output at different frequencies, and fed into the voltage converter. For example, a signal can be output with a certain voltage, the frequency of which changes over time. For example, an alternating voltage of constant amplitude can be output, the frequency of which continuously passes through a predefined range, for example a range of from a few hertz to a few megahertz, for example a range of from 20 Hz to 2 MHz. Such signals are also known as sweep or chirp.

While the test signals are output via the test signal output, a plurality of measurement values are acquired at the reference signal input and at the response signal input. It is clear that, to acquire the measurement values at the response signal input, signals are received from the voltage converter via the impedance converter input, the impedance converter including the amplifier, the impedance converter output and the coupling between the impedance converter output and the response signal input. Each measurement value of the plurality of measurement values is assigned to a corresponding test signal of the plurality of test signals. Each measurement value of the plurality of measurement values can for example comprise an amplitude of the voltage signal at the reference signal input, an amplitude of a voltage signal at the response signal input, a ratio between the amplitude of the voltage signal at the reference signal input and an amplitude of the voltage signal at the response signal input, and a phase difference between the voltage signal at the reference signal input and the voltage signal at the response signal input.

The measuring lines used and the terminals at which the measuring lines are coupled to the voltage converter and the device, usually have an impedance which is frequency-dependent. In order to determine the transfer function of the voltage converter as precisely as possible, it is desirable to take the effects of these (frequency-dependent) impedances into account and to exclude them from calculation. Precise information on corresponding impedances is sometimes not available or can be variable, for example due to the different geometries of the terminals or due to different cable routings of the measuring lines. If, as described above, calibration values have been identified, these calibration values can be used to correct the acquired measurement values, so that it is possible to take into account at least the influencing of the measurement values by the (frequency-dependent) impedances of the measurement lines. According to one embodiment, a measurement value of the plurality of measurement values is corrected using a corresponding calibration value, wherein the measurement value and the corresponding calibration value are assigned to a respective test signal with an identical frequency. For example, at a respective frequency, a corresponding calibration value assigned to this frequency can be deducted from a measurement value assigned to this frequency.

If a correction of the measurement values is performed by means of the calibration values, the measurement values in the following embodiments preferably relate to the measurement values corrected by means of the calibration values.

According to one embodiment, a voltage ratio error between an expected voltage signal and a measured voltage signal is determined at the different frequencies based on the plurality of measurement values. An expected voltage signal can, for example, be determined on the basis of a voltage signal at the reference signal input and a transformation ratio of the voltage converter. For example, a respective voltage ratio error can be determined for various frequencies based on the amplitude of the voltage signal at the response signal input and based on the amplitude of the voltage signal at the reference signal input, taking into account a transformation ratio of the voltage converter. Furthermore a phase shift at different frequencies can be determined based on the measurement values. For example, a phase shift between the voltage signal at the response signal input and the voltage signal at the reference signal input can be determined for different frequencies.

The voltage ratio error or phase shift at the different frequencies can be depicted on a display device which is coupled to the frequency response analyzer. The display device can, for example, be a display device on a notebook, tablet PC or smartphone which is coupled to the frequency response analyzer.

Furthermore, characteristic values of the voltage converter can be determined based on the identified plurality of measurement values. Characteristic values of a voltage converter include, for example, a frequency at a voltage ratio error of 2%, a frequency at a voltage ratio error of 5%, a frequency at a voltage ratio error of 10%, a resonant frequency, and/or a voltage ratio error at a frequency of 50 Hz.

The characteristic values of the voltage converter can likewise be displayed on a display device coupled to the frequency response analyzer and be saved for long-term monitoring for example, for example on a notebook, tablet PC or smartphone.

Using the voltage ratio error and the phase shift, and also the characteristic values, a state of a voltage converter can be determined, for example by comparison with corresponding target values or corresponding values at start of operation or by observing a change in these values over a relatively long period of time. This makes it possible to ascertain if the voltage converter is in a correct state.

The previously described method can be carried out by means of the previously described device, for example.

BRIEF DESCRIPTION OF THE DRAWINGS

The invention will be explained in greater detail hereafter using preferred embodiments with reference to the drawings. In the drawings, identical reference numbers denote identical elements.

DETAILED DESCRIPTION OF EXEMPLARY EMBODIMENTS

The present invention will be explained in greater detail hereafter using preferred embodiments with reference to the drawings. In the figures, identical reference numbers denote identical or similar elements. The figures are schematic depictions of various embodiments of the invention. Elements depicted in the figures are not necessarily depicted true to scale. Rather, the various elements depicted in the figures are reproduced such that their function and their purpose can be understood by the person skilled in the art.

Connections and couplings, depicted in the figures, between functional units and elements can be implemented as direct or indirect connections or couplings. A connection or coupling can be implemented in a wired or wireless manner.

Methods and devices for testing a voltage converter will be described in detail below. The condition of a conventional voltage converter (i.e., inductive voltage converters) can be impaired by defects of the coils, for example insulation errors or displacements of the coils. The condition of an LPVT can be impaired by defects of the capacitors or ohmic components of the RC voltage divider. There are various reasons for these defects, such as the ingress of moisture into the insulation. Examining a voltage converter can help to prevent a power transmission network from being incorrectly controlled due to incorrect measurement values from the voltage converter or to prevent a total breakdown of the voltage converter. A total breakdown can endanger other apparatus parts or people.

Figure 1:
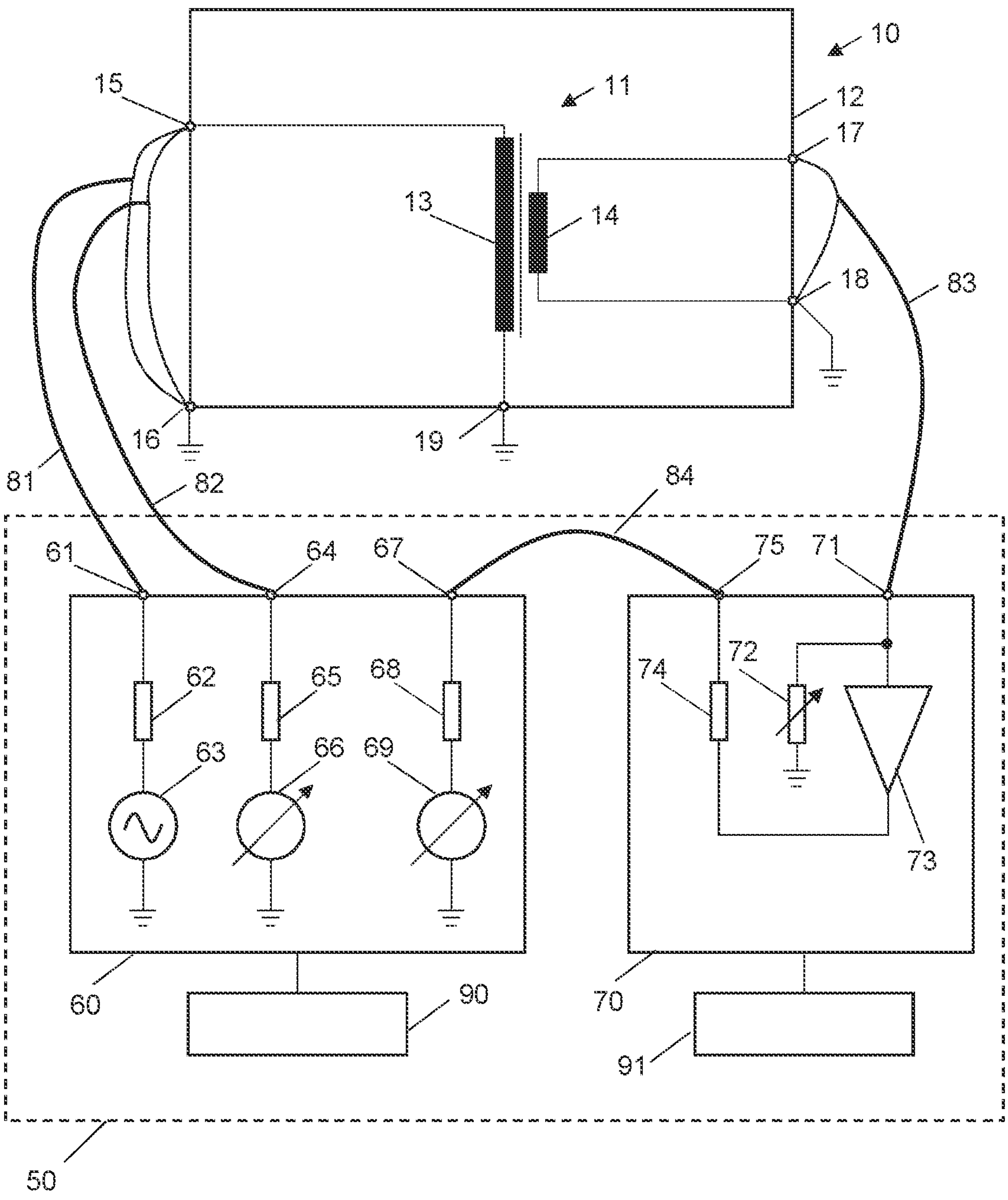
FIG. 1 schematically shows a device for testing a voltage converter according to one embodiment of the present invention in connection with a conventional voltage converter which is to be tested.

FIG. 1 schematically shows a conventional inductive voltage converter 10. The voltage converter 10 comprises a transformer 11 which is arranged in a housing 12. The transformer 11 comprises a primary coil 13 and a secondary coil 14. The primary coil 13 and the secondary coil 14 determine a transformation ratio Ü of the transformer 11. One end of the primary coil 13 is connected to a terminal 15 and another end of the primary coil 13 is connected to a terminal 19, which is coupled to ground. The secondary coil 14 is connected to two terminals 17 and 18. Reference number 16 denotes a ground connection of the housing 12. An output impedance of the voltage converter 10, as can be measured at terminals 17 and 18, is substantially determined by the secondary coil 14, for example, and can be in the range of a few ohms to a few 100 s of ohms or a few kiloohms.

FIG. 1 further shows a device 50 for testing the voltage converter 10. The device 50 comprises a frequency response analyzer 60 and an impedance converter 70. The frequency response analyzer 60 and the impedance converter 70 are depicted as two separate units in FIG. 1, but may be configured as one unit or at least integrated in a common housing.

The frequency response analyzer 60 comprises a signal-generating device 63 with an output impedance 62, which is configured to output a test signal, with variable frequency and a predefined voltage, at a test signal output 61. The test signal can, for example, be a low-voltage signal with a voltage of 10 V, for example. The signal-generating device 63 can, for example, output a sinusoidal voltage with a continuously increasing frequency, for example in a frequency range of from 10 Hz to 10 MHz, or for example in a range of from 20 Hz to 2 MHz.

The frequency response analyzer 60 further comprises a reference signal acquisition device 66 with an input impedance 65, which is coupled to a reference signal input 64. Furthermore, the frequency response analyzer 60 comprises a measurement signal acquisition device 69 with an input impedance 68, which is coupled to a response signal input 67.

The frequency response analyzer 60 can be a device that can be used for a SFRA (Sweep Frequency Response Analysis) measurement on power transformers. The output impedance 62 and the input impedances 65, 68 can each be 50 ohms, for example.

While the frequency response analyzer 60 outputs a sinusoidal test voltage, for example, with continuously increasing frequency at the test signal output 61, the frequency response analyzer 60 can receive a reference signal at the reference signal input 64 and a response signal at the response signal input 67 and can relate the response signal to the reference signal.

The frequency response analyzer 60 can be supplied with electrical power, from a battery 90 for example, for operating the frequency response analyzer 60. The device 50 further comprises the impedance converter 70. The impedance converter 70 has an impedance converter input 71 with an adjustable input impedance 72. The input impedance 72 can, for example, be adjusted in a range of from a few ohms to a few megaohms. The input impedance can be adjusted in a range of from 1 ohm to 10 megaohms, for example. The impedance converter 70 further comprises an amplifier 73, for example an operational amplifier, with adjustable amplification. The amplification can be adjustable in a range of from 1 to a few 1000 s, for example up to 2000 or 10,000. An output of the amplifier 73 is connected to an impedance converter output 75 via an output impedance 74. The output impedance 74 can, for example, be equal to the input impedance 68 of the frequency response analyzer 60, for example 50 ohms. The impedance converter 70 can be supplied with electrical power, from a battery 91 for example, for operating the impedance converter 70. The batteries 90, 91 can be provided as separate batteries or as a common battery. The batteries 90, 91 may be rechargeable batteries. Alternatively or additionally, the frequency response analyzer 60 and the impedance converter 70 can be supplied with electrical energy via a power supply unit.

To test the voltage converter 10, the primary side of the transformer 11 is coupled to the test signal output 61 and the reference signal input 64. Corresponding lines 81, 82, which are usually also referred to as measuring lines, can be configured as coaxial lines, for example. The outer conductors of the coaxial lines 81, 82 are each connected to ground at the frequency response analyzer 60, for example via a housing of the frequency response analyzer 60. At the voltage converter 10, the outer conductors of the coaxial lines 81, 82 are each connected to the housing ground 16. The inner conductor of the coaxial lines 81 is connected, at the frequency response analyzer 60, to the test signal output 61 and, at the voltage converter 10, to the terminal 15 which is coupled to the primary coil 13 of the transformer 11. The inner conductor of the coaxial lines 82 is connected, at the frequency response analyzer 60, to the reference signal input 64 and, at the voltage converter 10, to the terminal 15. Via the reference signal input 64, the reference signal recording device 66 thus acquires the test signal from the signal-generating device 63 as it is fed into the voltage converter 10, i.e. taking into account any disruptions or losses through the transmission via coaxial line 81. It is clear that lines 81, 82 can be realized in any other manner, for example in the form of twisted lines or as individual lines which only transmit the test signal or the reference signal but which do not establish any ground connection. In this case, a corresponding ground connection can be established via a separate connection between the device 50 and the voltage converter 10.

A further line 83, in particular a measuring line, for example a coaxial line, connects the secondary side of the voltage converter 10 to the impedance converter input 71. For example, at the voltage converter 10, an inner conductor of the coaxial line 83 can be connected to a side of the secondary coil 14 of the transformer 11 via the terminal 17 and an outer conductor of the coaxial line 83 to another side of the secondary coil 14 via the terminal 18. In addition, the terminal 18 can be connected to ground. At the impedance converter 70, the inner conductor of the coaxial line 83 can be connected to the impedance converter input 71, and the outer conductor of the coaxial line 83 to ground, for example via a housing of the impedance converter 70.

The impedance converter output 75 is connected to the response signal input 67 via a line 84, in particular a further measuring line, for example a coaxial line. For example, at the impedance converter 70, an inner conductor of the coaxial line 84 can be connected to the impedance converter output 75 and an outer conductor of the coaxial line 84 to ground, for example via the housing of the impedance converter 70. At the frequency response analyzer 60, the inner conductor of the coaxial line 84 can be connected to the response signal input 67, and the outer conductor of the coaxial line 84 to ground, for example via the housing of the frequency response analyzer 60.

Lines 83, 84 can be realized in any other manner, for example as twisted lines or as individual lines, which only transmit the response signal from the voltage converter 10 to the impedance converter 70 and the impedance-matched response signal from the impedance converter 70 to the frequency response analyzer 60 respectively, but do not produce a ground connection. An appropriate ground connection can be produced via separate connections between the voltage converter 10, the impedance converter 70 and the frequency response analyzer 60.

Figure 2:
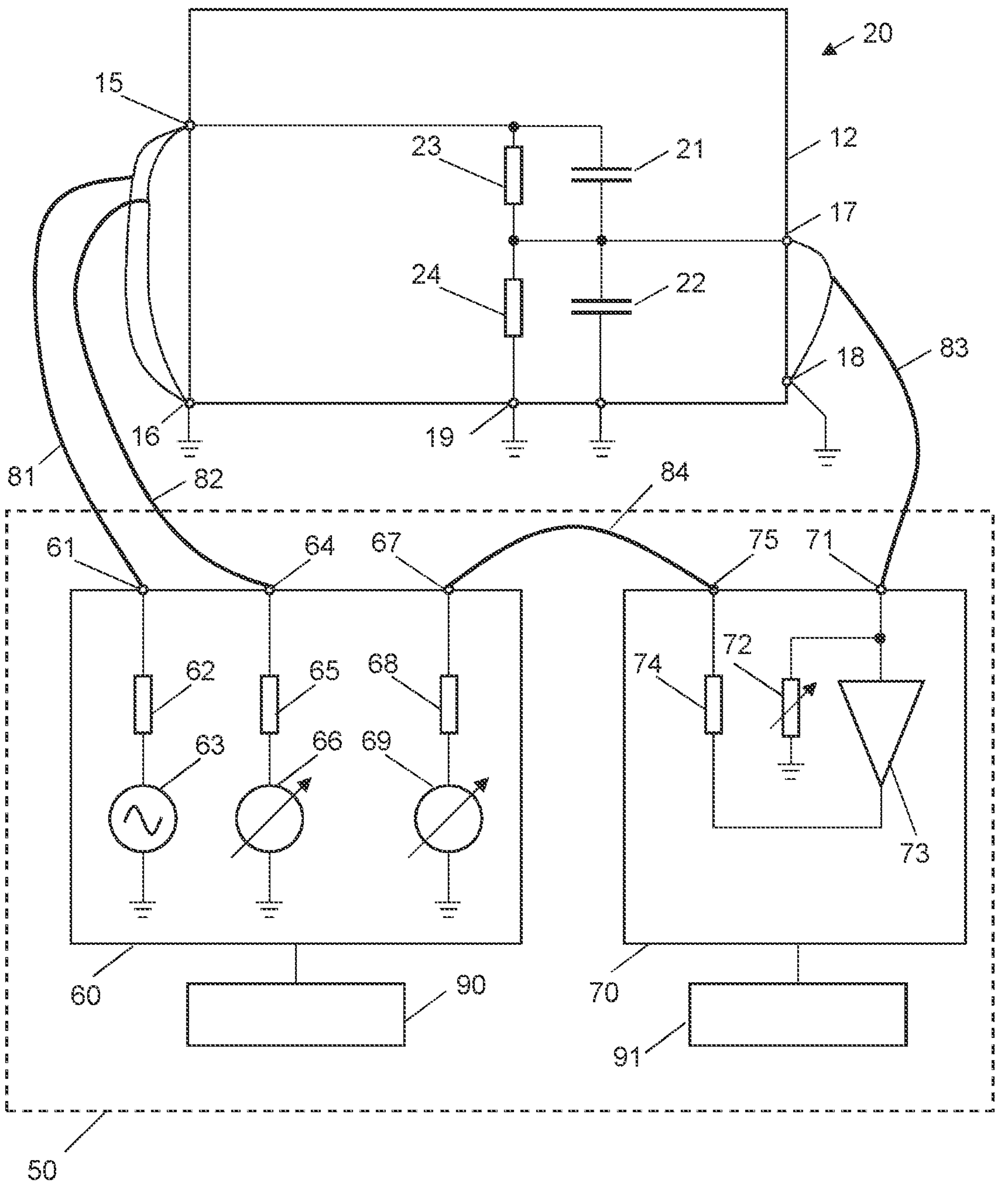
FIG. 2 schematically shows the device for testing a voltage converter from FIG. 1 in connection with a LPVT (for example an ohmic-capacitive voltage divider) which is to be tested.

FIG. 2 schematically shows a voltage converter 20 of an ohmic-capacitive LPVT type. The voltage converter 20 comprises a series connection of two capacitors 21 and 22, which function as capacitive voltage dividers. The series connection is connected to terminals 15 and 19. An ohmic resistor divider 23 and 24 is connected in parallel to this. An output impedance of the voltage converter 20, as can be measured at terminals 17 and 18, is therefore substantially determined by the capacitor 22 and the resistor 24. In contrast to the output impedance of the voltage converter 10 shown in FIG. 1, which can be in the range of from a few ohms to a few kiloohms, the output impedance of the voltage converter 20 can be in the range of from a few hundred kiloohms to a few megaohms. A transformation ratio of the ohmic-capacitive voltage converter 20 is determined both by the capacitances $C_1$ and $C_2$ of capacitors 21 and 22 and by the ohmic values $R_1$ and $R_2$ of resistors 23 and 24. A complex transfer function $k_R(j\omega)=U_2/U_1$ with the complex voltage $U_1$ between terminals 15 and 16 and the complex voltage $U_2$ between terminals 17 and 18 is:

$$\underline{k}_R(j\omega) = \frac{\underline{U}_2}{\underline{U}_1} = \frac{\underline{Z}_2}{\underline{Z}_{total}} = \frac{R_2}{R_2 + R_1 \cdot \left(\frac{1 + j\omega C_2 R_2}{1 + j\omega C_1 R_1}\right)}$$

The ohmic-capacitive voltage converter 20 shown in FIG. 2 is connected to the device 50 using the measuring lines 81 to 83 in the same manner as the inductive voltage converter 10 shown in FIG. 1.

Figure 3:
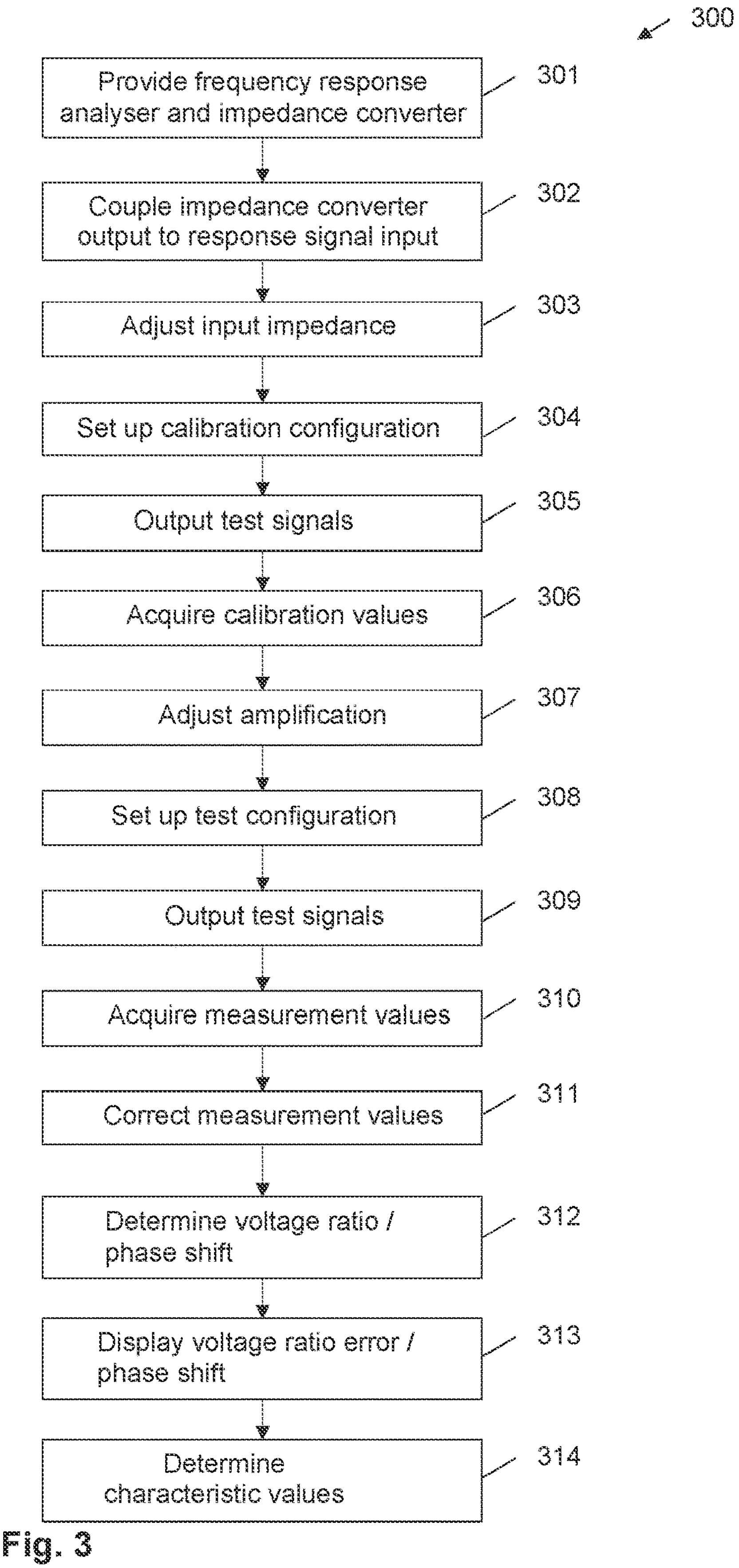
FIG. 3 shows method steps for testing a voltage converter according to one embodiment.

A method 300 for testing a voltage converter with the device 50 shown in FIGS. 1 and 2 will be described in detail below with reference to FIG. 3.

In step 301, the frequency response analyzer 60 and the impedance converter 70 are provided close to the voltage converter to be tested. The voltage converter can comprise, for example, the inductive voltage converter 10 shown in FIG. 1 or the ohmic-capacitive voltage converter 20 shown in FIG. 2. In step 302, the impedance converter output 75 of the impedance converter 70 is coupled to the response signal input 67 of the frequency response analyzer 60 via line 84. As previously described, the output impedance 74 of the impedance converter 70 at the impedance converter output 75 substantially corresponds to the input impedance 68 of the frequency response analyzer 60 at the response signal input 67.

Depending on the voltage converter 10, 20 to be tested, the input impedance 72 of the impedance converter 70 is adjusted in step 303. The output impedance of the voltage converter 10, 20 can either be acquired by measurement or can be adopted, or determined, from a rating plate of the voltage converter, for example from the load specified on the rating plate of the voltage converter.

Optionally, a calibration of the device 50 can be performed in steps 304-306, taking into account the measuring lines 81-83. For this purpose, a calibration configuration can be set up in step 304. Line 81 is connected to the test signal output 61, line 82 is connected to the reference signal input 64 and line 83 is connected to the impedance converter input 71. The three free ends of lines 81, 82 and 83 are connected directly to one another. If lines 81, 82 and 83 are coaxial lines, the inner conductors of lines 81, 82 and 83 are directly connected to one another and, separately from this, the outer conductors of lines 81, 82 and 83 are connected directly to one another. In step 305, test signals are generated by the signal-generating device 63 and are output via the test signal output 61. The test signals can comprise so-called chirp signals, for example, i.e. a signal whose frequency changes over time, for example. The test signals can comprise so-called sweep signals, for example, i.e. an alternating voltage of constant amplitude, the frequency of which periodically and continuously goes through a predefined range. The test signals can, for example, comprise voltage signals with an amplitude in the range of a few volts, for example 10 V.

While the test signals are output in step 305, corresponding calibration values, for example voltage signals, are acquired in step 306 at the reference signal input 64 and (via the impedance converter 50) at the test signal input 67. Transmission properties of in particular line 82, line 83, the impedance converter 70 and line 84 can be identified by analyzing the calibration values and can subsequently be used to correct measurement values when testing the voltage converter 10, 20. A calibration value can for example comprise a voltage signal at the reference signal input and a further calibration value can comprise a voltage signal at the response signal input, for example. Additional calibration values can be determined from the acquired calibration values. For example, an amplitude ratio between the amplitude of the voltage signal at the reference signal input and an amplitude of a voltage signal at the response signal input can be determined as an additional calibration value. For example, a phase difference between the voltage signal at the reference signal input and the voltage signal at the response signal input can be determined as an additional calibration value. The acquired and additionally determined calibration values can be acquired at different frequencies or be determined for different frequencies and assigned to the different frequencies. For example, corresponding amplitude ratios and phase differences can be assigned to some or all of the plurality of different frequencies at which the test signal was output.

At the end of the calibration, those ends of lines 81, 82 and 83 which are directly connected to one another are separated from one another.

Next, the amplification of the amplifier 73 of the impedance converter 70 is adjusted in step 307. When adjusting the amplification, findings from the previous calibration, for example, can be taken into account. For example, the amplitude ratio at a particular frequency or an average value of the amplitude ratios over a particular frequency range can be identified in order to adjust the amplification of the amplifier 73 in such a way that the amplitude ratio is substantially equalized. Furthermore, when adjusting the amplification of the amplifier 73, a transformation ratio of the voltage converter can be taken into account as well as an input sensitivity of the response signal input, so that a voltage range to be expected at the output of the voltage converter 10 due to the test signal lies within the measurement range of the measurement signal acquisition device 69 and also utilizes this range as far as possible.

In step 308, a test configuration is set up in connection with the voltage converter 10 or 20. As shown in FIG. 1 and FIG. 2, the test signal output 61 is coupled to the terminal 15 of the voltage converter 10 or 20 via line 81. If line 81 also carries a ground connection, this is connected to the ground 16 of the housing 12 of the voltage converter 10, 20. The reference signal input 64 is also connected to the terminal 15 of the voltage converter 10, 20 via line 82 and, if line 82 carries a ground connection, this is connected to the terminal 16 (ground) of the housing 12 of the voltage converter 10, 20. The impedance converter 71 is coupled to terminal 17 of the voltage converter 10, 20 via line 83 and, if line 83 carries a ground connection, this is connected to terminal 18 of the housing 12 of the voltage converter 10, 20. It should be noted that line 84 still connects the impedance converter output 75 to the response signal input 67 of the frequency response analyzer 60.

In step 309, test signals are generated by the signal-generating device 63 and are output via the test signal output 61 and line 81 is fed into the primary side of the voltage converter 10, 20. The test signals can comprise so-called chirp signals, for example, i.e. a signal whose frequency changes over time, for example. The test signals can, for example, comprise so-called sweep signals, i.e. an alternating voltage of constant amplitude, the frequency of which periodically and continuously goes through a predefined range. The test signals can, for example, comprise voltage signals with an amplitude in the range of a few volts, for example 10 V. Other test signals are possible, for example signals with constant frequency and variable amplitude, pulse signals and the like.

While the test signals are output in step 309, corresponding measurement values, for example voltage signals, are acquired in step 310 at the reference signal input 64 and (via the impedance converter 50) at the test signal input 67 by means of the reference signal acquisition device 66 and the measurement signal acquisition device 69 respectively. Transmission properties of the voltage converter 10, 20 can be identified by analyzing these measurement values, for example by means of a processing device (not shown) (e.g. a microprocessor with assigned memory) of the frequency response analyzer 60. If the previously described calibration has been carried out, the acquired measurement values can be corrected in step 311 with the aid of the calibration values. As a result, it is possible to correct, in particular, influences of line 82, line 83, the impedance converter 70 and line 84 on the acquired measurement values.

The measurement values can comprise a voltage signal at the reference signal input and a voltage signal at the response signal input, for example. Additional values can be determined from the acquired measurement values. For example, an amplitude ratio between the amplitude of the voltage signal at the reference signal input and an amplitude of the voltage signal at the response signal input can be determined. Furthermore, a phase difference between the voltage signal at the reference signal input and the voltage signal at the response signal input can be determined. The acquired measurement values and the additionally determined values can be acquired at different frequencies or be determined for different frequencies and assigned to the different frequencies. For example, corresponding amplitude ratios and phase differences can be assigned to some or all of the plurality of different frequencies at which the test signal was output.

The amplitude ratio and/or the phase difference can be corrected by means of corresponding values from the calibration. The correction can be performed for a relevant frequency to which the amplitude ratio and phase difference are assigned.

A transfer function of the voltage converter can be determined on the basis of the measurement values identified in this way and additionally determined values. For example, a voltage ratio error of the voltage converter can be identified in step 312, in particular voltage ratio errors can be determined for the various frequencies at which the test signal has been fed into the voltage converter. Furthermore, a phase shift of the voltage converter can be determined for the various frequencies in step 312. In step 313, the voltage ratio error and/or the phase shift can be displayed on a display device, for example in the form of a diagram, over the frequency. The display device can, for example, be a display device of a notebook, tablet PC or smartphone connected to the device 50.

Furthermore, in step 314, characteristic values of the voltage converter 10, 20 can be calculated on the basis of the identified measurement values and the additionally determined values, and displayed. A characteristic value of the voltage converter 10, 20 can for example be a frequency at a voltage ratio error of 2%. For example, starting from a nominal frequency of 50 Hz, it is possible to determine the higher frequency up to which the voltage ratio error is less than 2%. The frequency at which the voltage ratio error is 2% or more for the first time can be displayed as a corresponding characteristic value. A corresponding characteristic value can for example be determined starting from the nominal frequency of 50 Hz in the direction of lower frequencies. Further characteristic values of the voltage converter can for example be a frequency at a voltage ratio error of 5% or 10%. A further characteristic value of the voltage converter can be the resonant frequency of the voltage converter 10, 20, for example the frequency at which the largest output amplitude is achieved at constant input amplitude or the output signal has a phase angle of 90° to the input signal. The voltage ratio error at nominal frequency, for example at 50 Hz, can be determined as a further characteristic value.

In summary, the combination of the frequency response analyzer 60 and the impedance converter 70 offers the possibility of testing both conventional inductive voltage converters 10 and LPVT voltage converters 20. Furthermore, such a frequency response analyzer 60, in connection with the impedance converter 70 can be configured as a compact device which can be carried by an operator so that such tests can be easily performed on-site.

The described method is suitable for on-site measurements, so that the integrity and the transmission behavior can be examined in the installed state (e.g. during an on-site inspection or during a routine measurement) and the critical frequencies (for example at voltage ratio errors of 2%, 5%, 10%) can be examined or displayed over time. In addition, this method is also suitable for manufacturers in the production process, as the device 50 used is compact and lightweight and can therefore be integrated simply into the production process. Furthermore, the voltage levels used are low, as a result of which danger to the operating personnel can be reduced. The measurement itself is very precise, particularly through impedance matching and, if necessary, through calibration.

The impedance converter 70 not only has the characteristic that it matches the impedance to the nominal load of the voltage converter 10, 20, but rather also that it amplifies the signal applied to the secondary side of the voltage converter 10, 20. Furthermore, this measurement design has the advantage that the connection between the impedance converter 70 and the secondary side of the voltage converter 10, 20 can be kept short in order to avoid reflections. On the other side of the impedance converter, a (50-ohm) impedance matching is achieved. Furthermore, an amplification/phase calibration can be carried out easily with this measurement design, e.g. a measurement design calibration.

The invention claimed is:

1. A device for testing a voltage converter, comprising:
   - a frequency response analyzer which is configured to measure an electrical transfer function over a predefined frequency range, wherein the frequency response analyzer comprises a test signal output for outputting a plurality of test signals for the voltage converter, a reference signal input for receiving a reference signal which is applied to the voltage converter for the purpose of testing the voltage converter, and a response signal input having a predefined input impedance for receiving a response signal from the voltage converter, and
   - an impedance converter having an impedance converter input, which has a variable input impedance which can be adjusted to an impedance of the voltage converter, and an impedance converter output, which is coupled to the response signal input and has an output impedance matched to the input impedance of the response signal input, wherein, in a first state, the test signal output and the reference signal input are connected to a first terminal of the voltage converter via measuring lines and the impedance converter input is connected to a second terminal of the voltage converter via a measuring line, and wherein the frequency response analyzer is configured to output the plurality of test signals via the test signal output at different frequencies, and to acquire a plurality of measurement values at the reference signal input and the response signal input via the impedance converter and impedance converter input, wherein each measurement value of the plurality of measurement values is assigned to a corresponding test signal of the plurality of test signals.

2. The device according to claim 1, wherein the input impedance of the impedance converter input can be adjusted in a range of from 30 ohms to 100 megaohms.

3. The device according to claim 1, wherein the predefined input impedance of the response signal input of the frequency response analyzer is 50 ohms.

4. The device according to claim 1, wherein an output impedance at the test signal output of the frequency response analyzer is 50 ohms and an input impedance of the reference signal input of the frequency response analyzer is 50 ohms.

5. The device according to claim 1, further comprising at least one battery which is configured to provide electrical power for the purpose of running the frequency response analyzer and/or the impedance converter.

6. The device according to claim 1, wherein the device is configured as a mobile portable device.

7. The device according to claim 1, wherein the impedance converter comprises an amplifier with adjustable amplification.

8. A method of testing a voltage converter, wherein the method comprises:

providing a frequency response analyzer which is configured to measure an electrical transfer function over a predefined frequency range, wherein the frequency response analyzer comprises a test signal output for outputting a test signal for the voltage converter, a reference signal input for receiving a reference signal which is applied to the voltage converter for the purpose of testing the voltage converter, and a response signal input having a predefined input impedance for receiving a response signal from the voltage converter, providing an impedance converter having an impedance converter input, which has a variably adjustable input impedance, and an impedance converter output, which has an output impedance matched to the input impedance of the response signal input, coupling the impedance converter output to the response signal input, adjusting the input impedance of the impedance converter to an impedance of the voltage converter, connecting the test signal output to the reference signal input and the impedance converter input via measuring lines which are connected to the test signal output, the reference signal input and the impedance converter input respectively, outputting a plurality of test signals via the test signal output at different frequencies, and acquiring a plurality of calibration values at the reference signal input and the response signal input via the impedance converter and impedance converter input, wherein each calibration value of the plurality of calibration values is assigned to a corresponding test signal of the plurality of test signals.

9. The method according to claim 8, wherein each calibration value of the plurality of calibration values comprises at least one of the following values:

an amplitude of a voltage signal at the reference signal input, a ratio between the amplitude of the voltage signal at the reference signal input and an amplitude of a voltage signal at the response signal input, and a phase difference between the voltage signal at the reference signal input and the voltage signal at the response signal input.

10. The method according to claim 8, further comprising:

adjusting an amplification of an amplifier of the impedance converter depending on at least one of the plurality of calibration values.

11. A method of testing a voltage converter, wherein the method comprises:

providing a frequency response analyzer which is configured to measure an electrical transfer function over a predefined frequency range, wherein the frequency response analyzer comprises a test signal output for outputting a test signal for the voltage converter, a reference signal input for receiving a reference signal which is applied to the voltage converter for the purpose of testing the voltage converter, and a response signal input having a predefined input impedance for receiving a response signal from the voltage converter, providing an impedance converter having an impedance converter input, which has a variably adjustable input impedance, and an impedance converter output, which has an output impedance matched to the input impedance of the response signal input, coupling the impedance converter output to the response signal input, adjusting the input impedance of the impedance converter to an impedance of the voltage converter, connecting the test signal output and the reference signal input to a first terminal of the voltage converter via measuring lines and connecting the impedance converter input to a second terminal of the voltage converter via a measuring line, outputting a plurality of test signals via the test signal output at different frequencies, and acquiring a plurality of measurement values at the reference signal input and the response signal input via the impedance converter and impedance converter input, wherein each measurement value of the plurality of measurement values is assigned to a corresponding test signal of the plurality of test signals.

12. The method according to claim 11, wherein each measurement value of the plurality of measurement values comprises at least one of the following values:

an amplitude of a voltage signal at the reference signal input, a ratio between the amplitude of the voltage signal at the reference signal input and an amplitude of a voltage signal at the response signal input, and a phase difference between the voltage signal at the reference signal input and the voltage signal at the response signal input.

13. The method according to claim 11, further comprising:

correcting a measurement value of the plurality of measurement values using a calibration value, wherein the measurement value and the calibration value are assigned to a respective test signal with an identical frequency.

14. The method according to claim 11, further comprising:

determining a voltage ratio error and/or a phase shift at the different frequencies based on the plurality of measurement values, and depicting the voltage ratio error and/or the phase shift at the different frequencies on a display device which is coupled to the frequency response analyzer.

15. The method according to claim 11, further comprising:

determining characteristic values of the voltage converter based on the plurality of measurement values, wherein the characteristic values comprise at least one value from a group comprising:

a frequency at a voltage ratio error of 1%, a frequency at a voltage ratio error of 5%, a frequency at a voltage ratio error of 10%, a resonant frequency, and a voltage ratio error at a frequency of 50 Hz.

16. The device according to claim 2, wherein the input impedance of the impedance converter input can be adjusted in a range of from 50 ohms to 100 megaohms.

* * * * *